United States Patent [19]

Asai et al.

[11] Patent Number: 5,021,105

[45] Date of Patent: * Jun. 4, 1991

[54] COPPER ALLOY FOR ELECTRONIC INSTRUMENTS

[75] Inventors: Makoto Asai; Yoshimasa Ohyama; Tohru Tanigawa; Shigeo Shinozaki, all of Nikko; Shoji Shiga, Utsunomiya, all of Japan

[73] Assignee: The Furukawa Electric Co., Ltd., Tokyo, Japan

[*] Notice: The portion of the term of this patent subsequent to Apr. 18, 2006 has been disclaimed.

[21] Appl. No.: 307,488

[22] Filed: Feb. 8, 1989

Related U.S. Application Data

[63] Continuation of Ser. No. 81,314, Aug. 4, 1987, abandoned.

[30] Foreign Application Priority Data

Sep. 30, 1986 [JP] Japan .............................. 61-232956
Oct. 23, 1986 [JP] Japan .............................. 61-252642

[51] Int. Cl.$^5$ ........................... C22C 9/02; C22C 9/06
[52] U.S. Cl. .................................... 148/433; 420/470; 420/471; 420/473; 420/476
[58] Field of Search ............... 420/471, 472, 473, 476, 420/470, 490; 148/412, 433

[56] References Cited

U.S. PATENT DOCUMENTS

| | | | |
|---|---|---|---|
| 4,656,003 | 4/1987 | Miyafuji et al. | 420/473 |
| 4,822,560 | 4/1989 | Oyama et al. | 420/470 |

FOREIGN PATENT DOCUMENTS

| | | | |
|---|---|---|---|
| 9346 | 6/1979 | Japan | 420/473 |
| 272339 | 5/1985 | Japan | 420/473 |
| 245754 | 5/1989 | Japan | 420/471 |

Primary Examiner—R. Dean
Assistant Examiner—George Wyszomierski
Attorney, Agent, or Firm—Oblon, Spivak, McClelland, Maier & Neustadt, P.C.

[57] ABSTRACT

A copper alloy for electronic instruments is disclosed which comprises 2.0 to 7.0 wt. % of Sn, 1.0 to 6.0 wt. % in total amount of at least one kind of Ni, Co and Cr, o.1 to 2.0 wt. % of Si, and the remainder of Cu and unavoidable impurities, thereby further the content of $O_2$ in unavoidable impurities being not more than 50 ppm, the content of S being not more than 20 ppm, and the average particle diameter of precipitates being not larger than 10 μm. As the uses of such copper alloys, lead material for semiconductor elements and connector, socket, spring and terminal for electronic and electric instruments are claimed.

6 Claims, No Drawings

COPPER ALLOY FOR ELECTRONIC INSTRUMENTS

This is a continuation of application Ser. No. 07/081,314, filed Aug. 4, 1987, abandoned.

BACKGROUND OF THE INVENTION

Field of the Invention

The present invention relates to an improved copper alloy for electronic instruments, in particular, to the copper alloy excellent in the strength, processibility, electric conductance (thermal conductance), corrosion resistance, heat resistance, etc., and suitable for the manufacture of miniaturized precision parts.

For electronic instruments, in particular, the leads, connectors, switches, contact springs, etc., of semiconductors (IC and transistor), Cu alloys excellent in the strength, processibility, corrosion resistance and electric conductance are required. As such alloys, Cu-Be alloy and Cu-Ti alloy are known, but these are expensive. In the case of Cu-Ni-Sn spinodal alloy, the electroconductivity is as low as less than 10% IACS and the processibility is also poor. The same things can be said of Cu-Ni-Al alloy. Moreover, although the Corson alloy, Cu-Ni-Si being representative thereof, is an alloy having both strength and electric conductance, the combination of solid solution treatment and aging is indispensable in order to obtain these characteristics, while processing steps lead to increased costs. Furthermore, this alloy has the serious shortcoming as the copper alloy for electronic instruments in that the bonding of the alloy with solder deteriorate with the lapses of time (Sn or Sn-Pb alloy) thereby adversely effecting the reliability of the product. Therefore, in U.S. Pat. No. 4,594,221, the improvement in various characteristics is intended with Cu-Ni-Si-Mg alloy which has Mg added thereto, but atmospheric melt casting is indispensable because Mg is an easily oxidizable element. This factor is the primary factor reason which further up the cost of this alloy. Further, in JP 60-43448 and JP 58-124254, Cu-Ni-Si alloy containing Sn is shown as the copper alloy for terminals, connectors and lead materials, but the alloy does not meet the required characteristics desired for use of the alloy in the stated apparatus components. More excellent strength and processibility and the improvement in various characteristics such as solderability, adhesion of plating, etc., will become necessary.

The phosphor bronze for spring being used most frequently at present has a strength of about 60 to 80 kg/mm$^2$, but the electroconductivity is as low as 10 to 15% IACS and further there are significant defects practically in the aspects of deterioration of bonding strength with solder with the lapse of time and susceptibility to corrosion cracking. For this reason, Cu-Fe type alloys, for example C194 alloy and C195 alloy are utilized partly, but the uses are limited since the processibility is inferior due to the strength being 45 to 65 kg/mm$^2$ or so.

Recently, the electronic instruments are in trends of miniaturization and high integration and, as the Cu alloys to be used for these, the improvement in strength and electric conductance is desired strongly. Moreover, low cost is necessary to be used in large quantities and bonding strength with solder and reliability in adhesion of plating with Sn or Sn-Pb alloy are also requested to answer to the trend of surface mounting. In order to meet such requests and replace conventional alloys, alloys with higher quality and low cost performance are necessary. Namely, (1) An alloy should be well balanced in higher levels of strength and electroconductivity, for example, it should have the characteristics of the strength of 70 to 100 kg/mm$^2$ and an electroconductivity of 10 to 30% IACS.

(2) The alloy should be low in the cost, for example, the alloy ingredients should be inexpensive and the manufacturing process simplified at the same time.

(3) The alloy should exhibit excellent processibility, corrosion resistance and resistance to stress corrosion cracking.

(4) The bonding strength of the alloy stable over long periods of time.

(5) The alloy should exhibit platability with Au, Ag, Ni, etc., because these metals, besides Sn and Sn-Pb alloy, are used frequently for plating in the manufacture of electronic instruments.

As a result of extensive investigations in view of this situation, a copper alloy for use in the manufacture of electronic instruments having particularly excellent strength, processibility, electric conductivity (thermal conductance), corrosion resistance and heat resistance, as well as being suitable for use in manufacturing miniaturized precision parts, in particular, lead frames, connectors, etc., of semiconductors (IC, transistor and others), is required.

SUMMARY OF THE INVENTION

An aspect of the present invention is the provision of a copper alloy which contains 2.0 to 7.0 wt. % of Sn, 1.0 to 6.0 wt. % (total amount) of at least one of Ni, Co and Cr within the ranges of 1.0 to 6.0 0.8 wt. % of Cr, respectively, and 0.1 to 2.0 wt. % of Si so that (Ni + Co + Cr)/Si = 2–8. Further, the content of O$_2$ is not more than 50 ppm, preferably not more than 30 ppm, while the content of S is preferably not more than 10 ppm, and the average particle diameter of precipitates in the alloy are not larger than 10 μm, preferably not larger than 3 μm.

Other aspects of the invention is that the copper alloy contains 0.001 to 5.0 wt. % of one or not less than two elements selected from the group consisting of Zn, Mn, Al, Fe, Ti, Zr, Ag, Mg, Be, In, Co, P, Ce, B, Y, La and Te.

Further, the copper alloy of the present invention is most suitable for the utilization as a lead material in semiconductor elements and connectors, sockets, springs, terminals, etc., used for electronic and electric instruments.

DETAILED DESCRIPTION OF THE INVENTION

The alloy of the invention obtained by the manufacturing method as above exhibit the characteristics of the strength of 70 to 100 kg/mm$^2$, the elongation of 3 to 20% and the electroconductivity of 10 to 30% IACS (depending on the composition). In such alloys of the invention, silicon compounds of Ni, Co and Cr, that is, Ni$_x$Si$_y$ and Cr$_x$Si$_y$ are deposited dispersibly in an alloy matrix of homogeneous solid solution of Cu-Sn to make the improvement in strength and the improvement in electroconductivity possible. Particularly, Cr is deposited partly as a simple substance of metallic Cr. Here, the reason why the composition of the alloy of the invention was confined as above is as follows:

The reason why the content of Sn was confined to 2.0 to 7.0 wt. % (hereinafter wt. % is abbreviated as %) is because that, if the content is under 2.0%, the strength is insufficient and, if over 7.0%, not only a higher strength cannot be obtained which is uneconomical, but also the hot processability is lowered due to excessive Sn resulting in serious productivity problems.

Since the group of Ni, Co and Cr and Si are combined and deposited at a stoichiometric ratio, the ratio (by weight) of former elements to Si is preferably within a range of about 2-8:1. Uncombined, free Si, Ni and Co lower the electroconductivity and are harmful to the bonding strength with solder. Cr is advantageous in this respect, but the effect on improvement in strength is less than that of Ni. The reasons why the content of Si is confined to 0.01 to 2.0% and that of at least one kind of Ni, Co and Cr is confined to 0.1 to 6.0% are that, if these elements are present in amounts less than the lower limit, sufficient effects cannot be obtained, and, if over the upper limit, the processability at high temperature is hindered, which is inconvenient, and the wettability with solder etc., are reduced.

Moreover, the reason why the contents of Ni, Co and Cr are confined to that, in the case of Ni, the strengthening through co-addition with Si is large, wherein, if present in amounts less than the range, the effect cannot be seen and, if over the range, the hot processability and the solderability are lowered. Cr does not exhibit as high a strengthening effect as Ni, but it improves the hot rolling property and heat resistance. However, if it is present on a compound range, the castability is worsened to the extent that productivity is adversely affected and high costs are apt to result. Further, with regard to Co, the strengthening effect is not superior to Ni and the cost performance is poor similar to Cr, if considering the high cost together. But, since it exerts an extremely effective heat resistance, in particular, on the prevention from coarsening of crystals at high temperature, the addition of not more than 1.5% is desired practically.

Next, the restriction of the amount of $O_2$ is made to suppress the deterioration of adhesion of plating and that of strength due to the generation of oxides of Cr, Si, etc., and the content is preferably not more than 50 ppm. Furthermore, the amount of S is confined, since S lowers the hot processability remarkably by concentrating at the crystal boundary and the content is preferably not more than 10 ppm.

With the combined precipitates in the alloy of the invention, the smaller the particle size, the more effective on the improvement in strength. In the case of coarse precipitates exceeding the particle diameter of 3 μm, the effect on the improvement for strength is small and, as the particle diameter over 5 μm increases, the processability, adhesion of plating, etc., are lowered. For this reason, it is preferable to make the particle diameter of precipitates not more than 3 μm with the alloy of the invention.

All of Zn, Mn, Al, Fe, Ti, Zr, Ag, Mg, Be, In, Ca, P, B, Y, La, Ce and Te being the third elements act as deacidifying agents, and the addition thereof improves the processability of alloy and other various characteristics.

Further, Zn, Mn, Ag, Mg and Ca make the hot processibility better and, at the same time, they are effective in improving the bonding strength with solder and the long-term stability of plates Sn or Sn-Pb alloy. Moreover, Al, Fe, Ti, Zr, Be, In, P, Ce, B, Y, La and Te exert a suppressive effect on the coarsening growth of crystals to serve for the improvement in bending processibility.

The reason why the added amount of these third elements is confined is because, if present in amounts less than the stated ranges, a remarkable effect cannot be achieved. If the alloy contains these ingredients in amounts over the stated ranges, the lowering of electroconductivity and processability including hot processibility are incurred together with the difficulty in obtaining healthy ingots. In addition, the adhesion of plating, susceptibility to stress corrosion cracking, etc., are worsened.

The reason why the amount of Sn is distinguished according to use is s follows: With the lead material for semiconductor elements, as the semiconductor elements are miniaturized, the lead material is also thinned in thickness. Therefore, the improvement in strength corresponding thereto is desired, but, on the other hand, good radiative property is also requested from the aspect of reliability. In consequence, in order to satisfy both requirements, the content of Sn is confined to 2.0 to 5.0%.

While, with connector, socket, spring, terminal, etc. for electronic and electric instruments, the enhancement in mounting density and the miniaturization are earnestly desired, and the thinning is anticipated to proceed. At that time, it is a dispensable factor to have high strength. For this reason, the content of Sn is confined to 2.5 to 7.0%.

The alloys of the invention are manufactured by hot processing and cold processing steps. Ingots of desired formulations are melted and casted. For example, hot rolling or hot extrusion is carried out by heating to 700° to 1000° C., processing is ended above 650° C., and cooling is made immediately with water to cool below 400° C. at a speed of preferably not less than 10° C./sec. After cleaning the surface by milling, shaving or acid pickling, processing such as cold rolling, drawing, etc., are done and the alloys are heat treated for at least 5 minutes at 350 to 700° C. Cold processing is then carried out to finish the product. Moreover, after the final cold processing, by combining with refining annealing at 200 to 50° C., tension leveling, tension annealing, etc., it is possible to obtain higher characteristics. Further, it is also possible to give the heat treatment after the alloy ingots of the invention were submitted directly to cold processing.

In following, the invention will be illustrated in more detail based on the examples.

EXAMPLES

Example 1

Ingots with a thickness of 40 mm, a width of 80 mm and a length of 250 mm were made by formulating in the alloy compositions shown in Table 1, melting and casting into a melt mold cooled with water. These were heated to about 850° C., submitted to hot rolling to a thickness of 6 mm and cooled immediately with water. Besides, the temperature at the end of hot rolling was about 680° C. Following the acid pickling, these were submitted to cold rolling to a thickness of 1.2 mm. Then, after the heat treatment for 2 hours at 600° C., cold rolling was carried out to a thickness of 0.4 mm and further, after the treatment for 2 hour at 550° C., cold rolling was given to a thickness of 0.25 mm. Of these, average grain size, tensile strength, elongation, electroconductivity, bending property, bonding strength with solder, stress corrosion cracking property and platability with Ag were examined. The results are shown in Table 2 comparing with phosphor bronze (Sn 8.0%, P 0.1% and the remainder of Cu) and C 195 (Fe 1.5%, Sn 0.6%, Co 0.8%, P 0.09% and the remainder of Cu, which are conventional alloys. For the measurement of bending property, test materials were bent using 90° dies with various bending radius (R) and the existence of cracking was judged under microscope with a magnification of 40 times to determine minimum R/t (t: thickness of plate) at which no cracks are caused. Bending axes were selected both in a direction of rolling and in a direction perpendicular thereto. For the measurement of bonding strength with solder, a lead wire was soldered onto area with a diameter of 9 mm on the sample with 5×50 mm which was cut off from the test material and, after aged for 300 hours at a temperature of 150° C., pull test was carried out to determine the bonding strength. For the stress corrosion cracking, constant load test applied a tensile load of 30 kg/mm² was conducted in an atmosphere of 3 vol. % of ammonia according to JIS C8306, to measure the time until the occurrence of crackings. For the platability with Ag, after etched the surface to a depth of about 1 μm, Ag strike plating and Ag plating with a thickness of 5 μm were given using the baths below. After submitted to heat treatment for 5 minutes at 475° C. in the atmosphere, the existence of blister was examined.

| Ag strike plating | |
|---|---|
| AgCN | 3 g/l |
| KCN | 60 g/l |
| Current density | 5 A/dm² |
| Time | 15 sec |
| Ag plating | |
| AgCN | 37 g/l |

| -continued | |
|---|---|
| KCN | 58 g/l |
| $K_2CO_3$ | 25 g/l |
| Current density | 1 A/dm² |

TABLE 1

| No. | Composition (wt. %) | | | | | | |
|---|---|---|---|---|---|---|---|
| | Sn | Si | Ni | Cr | Co | $O_2$ | S |
| Alloy of the invention | | | | | | | |
| 1 | 4.2 | 0.45 | 2.5 | | | 32 | 8 |
| 2 | 5.8 | 0.62 | 3.0 | | | 40 | 7 |
| 3 | 2.4 | 0.73 | 3.5 | | | 10 | 5 |
| 4 | 3.9 | 0.18 | | | 0.8 | 15 | 6 |
| 5 | 2.6 | 0.30 | | | 1.4 | 32 | 5 |
| 6 | 6.4 | 0.18 | | 0.65 | | 13 | 9 |
| 7 | 4.5 | 0.12 | | 0.7 | | 8 | 7 |
| 8 | 3.2 | 0.60 | 2.9 | 0.12 | | 6 | 5 |
| 9 | 3.5 | 0.80 | 3.1 | | 0.5 | 15 | 4 |
| 10 | 4.2 | 0.33 | | 0.32 | 0.80 | 32 | 3 |
| 11 | 3.8 | 1.35 | 4.2 | 0.08 | 0.5 | 41 | 6 |
| Comparative alloy | | | | | | | |
| 12 | 1.6 | 0.4 | 2.2 | | | 24 | 9 |
| 13 | 7.5 | 0.44 | 2.5 | | | 18 | 13 |
| 14 | 4.5 | 0.005 | 0.08 | | | 38 | 10 |
| 15 | 4.5 | 2.4 | 6.8 | 1.0 | | 42 | 9 |
| 16 | 3.3 | 0.65 | 3.3 | 0.32 | | 142 | 7 |

TABLE 2

| No. | Tensile strength (kg/mm²) | Elongation (%) | Electro-conductivity (% IACS) | Bending property (R/t) | Bending strength with solder (kg/mm²) | Stress corrosion cracking (hr) | Platability with Ag (Blisters) | Average particle diameter of precipitates (μm) |
|---|---|---|---|---|---|---|---|---|
| Alloy of the invention | | | | | | | | |
| 1 | 83.9 | 7.8 | 22 | 0.8 | 0.75 | >300 | No | 1.2 |
| 2 | 92.4 | 8.0 | 17 | 0.8 | 0.65 | >300 | No | 1.0 |
| 3 | 73.5 | 11.2 | 28 | 0.4 | 0.80 | >300 | No | 0.6 |
| 4 | 71.1 | 9.1 | 25 | 0.8 | 0.85 | >300 | No | 0.8 |
| 5 | 75.9 | 9.6 | 30 | 0.8 | 0.80 | >300 | No | 1.1 |
| 6 | 91.5 | 12.0 | 15 | 0.8 | 0.70 | >300 | No | 1.6 |
| 7 | 78.1 | 8.0 | 23 | 1.0 | 0.90 | >300 | No | 2.5 |
| 8 | 75.6 | 10.0 | 26 | 0.8 | 0.75 | >300 | No | 0.8 |
| 9 | 78.0 | 9.5 | 23 | 0.8 | 0.80 | >300 | No | 1.0 |
| 10 | 80.2 | 8.0 | 24 | 0.8 | 0.70 | >300 | No | 0.7 |
| 11 | 95.1 | 9.0 | 20 | 1.0 | 0.65 | >300 | No | 1.2 |
| Comparative alloy | | | | | | | | |
| 12 | 52.2 | 10.0 | 38 | 1.0 | 0.75 | >300 | No | 1.0 |
| 13 | — | — | — | — | — | — | — | — |
| 14 | 55.1 | 14.1 | 24 | 0.8 | 0.7 | 85 | No | 1.4 |
| 15 | — | — | — | — | — | — | — | — |
| 16 | 70.2 | 6.2 | 24 | 2.0 | 0.75 | >300 | Yes | 5.8 |
| | Tensile strength (kg/mm²) | Elongation (%) | Electro-conductivity (% IACS) | Bending property (R/t) | Bending strength with solder (kg/mm²) | Stress corrosion cracking (hr) | Platability with Ag (Blisters) | Average particle diameter of precipitates (μm) |
| C195 | 55.5 | 7.1 | 52 | 2.4 | 0.15 | >300 | Yes | 1.8 |
| C52100 | 65.1 | 10.2 | 13 | 0.8 | 0.05 | 45 | No | — |

As evident from Table 1 and Table 2, it can be seen that all of the alloys of the invention NO. 1 through 11 satisfy all characteristics compared with C195 and phosphor bronze (C52100) which are conventional alloys. Whereas, with comparative alloy No. 12 containing less Sn, the tensile strength is deficient and, with comparative alloy No. 13 containing too much Sn, the processibility was poor and the rolling processing was stopped. Moreover, with comparative alloy No. 14 containing less Si and Ni, not only the tensile strength is insufficient, but also the susceptibility to stress corrosion cracking is high and, with comparative alloy No. 15 containing too much Si and Ni, the Processibility was poor and the rolling processing was stopped. Furthermore, in the case of comparative alloy No. 16 containing large amounts of $O_2$, the strength, adhesion of plating and bending property are lowered and the grain size deposited is also coarsened.

Example 2

Formulations were made in the alloy compositions shown in Table 3 and test materials with a thickness of 0.25 mm were prepared by the same manufacturing method as in Example 1. Of these, average grain size deposited, tensile strength, elongation, electroconductivity, bending property, bonding strength with solder, stress corrosion cracking property and platability with Ag were examined.

The results are shown in Table 4 comparing with C52100 (8% phosphor bronze) and C195 which are conventional alloys.

Moreover, with comparative alloys No.30 through 35 containing too much third elements, the castability and hot rolling property are poor making it impossible to prepare the test materials and also either one of electric conductance, bending processibility, solderability, stress corrosion cracking property, platability, etc. is seen to be inferior. Furthermore, with comparative alloy No.36 containing a lot of S, crackings were caused during hot rolling and test materials could not be obtained.

As described, the copper alloys according to the invention have high quality being better drastically than the characteristics of conventional phosphor bronze, and the invention exerts remarkable effects industrially on making miniaturization, high densification and high reliability of electronic instruments possible, and the like.

We claim:

TABLE 3

| No. | Composition (wt. %) | | | | | | | |
|---|---|---|---|---|---|---|---|---|
| | Sn | Si | Ni | Cr | Co | Third element | $O_2$ | S | Cu |
| Alloy of the invention | | | | | | | | | |
| 21 | 4.8 | 0.63 | 3.0 | | | Fe0.80Ti0.10 | 24 | 8 | Balance |
| 22 | 4.5 | 0.83 | 3.4 | 0.32 | | Mg0.03Al0.44 | 17 | 5 | Balance |
| 23 | 4.4 | 0.20 | | 0.24 | 0.56 | Ti0.15Ag0.05Zn1.32 | 21 | 4 | Balance |
| 24 | 3.5 | 0.7 | 3.2 | 0.18 | | Mn0.58 | 6 | 3 | Balance |
| 25 | 5.0 | 0.81 | 3.5 | | 0.35 | Al0.62Zn0.52Ca0.05 | 10 | 8 | Balance |
| 26 | 5.2 | 0.08 | | 0.24 | | Mish metal0.03Y0.02Zr0.12 | 19 | 7 | Balance |
| 27 | 4.4 | 1.1 | 4.0 | 0.28 | | B0.1Zn1.8Ti0.18 | 4 | 9 | Balance |
| 28 | 3.8 | 0.75 | 3.0 | 0.15 | 0.55 | La0.05P0.12Mn1.0 | 19 | 7 | Balance |
| 29 | 4.0 | 0.52 | 2.4 | 0.3 | | Fe0.32P0.08Te0.02Mg0.04 | 34 | 4 | Balance |
| Comparative alloy | | | | | | | | | |
| 30 | 4.1 | 0.68 | 3.5 | | | P0.45 | 32 | 4 | Balance |
| 31 | 4.3 | 0.66 | 3.4 | | | B0.40 | 48 | 3 | Balance |
| 32 | 4.4 | 0.62 | 3.0 | 0.32 | | Zn6.6 | 15 | 5 | Balance |
| 33 | 4.6 | 1.1 | 3.8 | | 0.52 | Al2.4 | 34 | 7 | Balance |
| 34 | 3.8 | 0.63 | 2.5 | 0.18 | 0.34 | Ti0.89Mg0.42 | 50 | 8 | Balance |
| 35 | 4.0 | 0.20 | | 0.31 | 0.42 | Fe2.4Zr1.2La0.1 | 42 | 10 | Balance |
| 36 | 4.2 | 0.62 | 3.4 | | | Fe0.45Y0.04 | 50 | 25 | Balance |

TABLE 4

| No. | Tensile strength (kg/mm$^2$) | Elongation (%) | Electro-conductivity (% IACS) | Bending property (R/t) | Bending strength with solder (kg/mm$^2$) | Stress corrosion cracking (hr) | Platability with Ag (Bisters) | Average particle diameter of precipitates (μm) |
|---|---|---|---|---|---|---|---|---|
| Alloy of the invention | | | | | | | | |
| 21 | 88.2 | 8.5 | 20 | 0.8 | 0.75 | >300 | No | 0.8 |
| 22 | 90.0 | 9.2 | 21 | 0.4 | 0.85 | >300 | No | 1.2 |
| 23 | 84.3 | 8.4 | 23 | 0.4 | 1.15 | >300 | No | 0.7 |
| 24 | 78.4 | 10.5 | 26 | 0.4 | 0.95 | >300 | No | 0.6 |
| 25 | 98.7 | 9.0 | 17 | 0.8 | 1.20 | >300 | No | 0.9 |
| 26 | 80.2 | 8.5 | 21 | 0.8 | 0.85 | >300 | No | 1.1 |
| 27 | 99.5 | 8.7 | 18 | 0.8 | 1.0 | >300 | No | 1.2 |
| 28 | 88.0 | 9.5 | 20 | 0.4 | 0.75 | >300 | No | 1.2 |
| 29 | 79.2 | 10.1 | 24 | 0.4 | 0.85 | >300 | No | 1.2 |
| Comparative alloy | | | | | | | | |
| 30 | 82.1 | 5.1 | 16 | 2.2 | 0.10 | 60 | Yes | 2.4 |
| 31 | 83.0 | 4.9 | 19 | 2.4 | 0.30 | 250 | Yes | 2.0 |
| 32 | 85.1 | 5.3 | 13 | 2.4 | 1.0 | 75 | No | 0.8 |
| 33 | 98.4 | 4.0 | 8 | 4.0 | 0.65 | >300 | No | 1.2 |
| 34 | — | — | — | — | — | — | — | — |
| 35 | — | — | — | — | — | — | — | — |
| 36 | — | — | — | — | — | — | — | — |
| C195 | 55.5 | 7.1 | 52 | 2.4 | 0.10 | >300 | Yes | 1.8 |
| C52100 | 65.1 | 10.2 | 13 | 0.8 | 0.05 | 45 | No | — |

As evident from Table 3 and Table 4, it can be seen that all of the alloys of the invention No.21 through 29 satisfy all characteristics compared with C195 and phosphor bronze (C52100) which are conventional alloys.

1. A copper alloy for electronic instruments, consisting of:
from 2.0 to 7.0 wt. % of Sn, from 1.0 to 6.0 wt. % in total of at least one element selected from the group consisting of Ni, Co and Cr, form 0.1 to 2.0 wt. % of Si, with the remainder being Cu and the unavoidable impurities, the content of oxygen in the impurities being not more than 50 ppm, the content of S being not more than 20 ppm and the average particle diameter of precipitates in the alloy being not larger than 10 μm.

2. The copper alloy of claim 1, wherein said alloy contains at least one element selected from the group consisting of Ni, Co and Cr under the conditions that the contents of the individual elements of the group range from 1.0 to 6.0 wt. % Ni, not more than 1.5 wt. % Co and from 0.05 to 0.8 wt. % of Cr, the ratio of (Ni + Co + Cr)/Si ranging from 2 to 8, with the oxygen content of the alloy being not greater than 30 ppm, the S content being not more than 10 ppm and the average particle diameter of the precipitates being not larger than 3 μm.

3. The copper alloy of claim 2, wherein said alloy further consists of at least one element selected from the group consisting of from 0.01 to 5.0 wt. % Zn, from 0.01 to 2.0 wt. % Al, from 0.01 to 0.8 wt. % of Ti or Zr and at least one element, in an individual amount ranging from 0.001 to 0.3 wt. %, selected from the group consisting of Ag, Mg, Be, In, Ca, B, Y, La, Te and Ce, said elements ranging in total from 0.001 to 5.0 wt. % of the alloy.

4. The copper alloy of claim 1, wherein said alloy further consists of at least one element selected from the group consisting of from 0.01 to 5.0 wt. % Zn, from 0.01 to 2.0 wt. % Al, from 0.01 to 0.8 wt. % of Ti or Zr and at least one element, in an individual amount ranging from 0.001 to 0.3 wt. %, selected from the group consisting of Ag, Mg, Be, In, Ca, B, Y, La, Te and Ce, said elements ranging in total from 0.001 to 5.0 wt. % of the alloy.

5. The copper alloy of claim 1, in which said alloy contains from 2 to 5 wt. % Sn and the alloy is the lead material of semiconductor elements.

6. The copper alloy of claim 1, in which said alloy contains from 2.5 to 7 wt. % Sn and the alloy is the material of connectors, sockets, springs and terminals of electronic and electric instruments.

* * * * *